United States Patent [19]
Rolson

[11] Patent Number: 5,759,724
[45] Date of Patent: Jun. 2, 1998

[54] METHOD FOR MAKING MULTI-PHASE, PHASE SHIFTING MASKS

[75] Inventor: J. Brett Rolson, Boise, Id.

[73] Assignee: Micron Technology, Inc., Boise, Id.

[21] Appl. No.: 829,403

[22] Filed: Mar. 31, 1997

[51] Int. Cl.$^6$ ............................................. G03F 9/00
[52] U.S. Cl. ................................. 430/5; 430/323
[58] Field of Search ........................ 430/5, 312, 313, 430/314, 323

[56] References Cited

U.S. PATENT DOCUMENTS

| | | | |
|---|---|---|---|
| 5,281,500 | 1/1994 | Cathey et al. | 430/5 |
| 5,288,568 | 2/1994 | Cathey, Jr. | 430/5 |
| 5,308,722 | 5/1994 | Nistler | 430/5 |
| 5,376,483 | 12/1994 | Rolfson | 430/5 |
| 5,487,962 | 1/1996 | Rolfson | 430/5 |

FOREIGN PATENT DOCUMENTS 4-254855  9/1992  Japan.

*Primary Examiner*—S. Rosasco
*Attorney, Agent, or Firm*—Stephen A. Gratton

[57] ABSTRACT

A method for making a phase shifting mask includes forming an opaque layer on a transparent substrate, and then etching phase shifters and phase transition areas in the substrate using a staged etch process. During the staged etch process, resist masks can be used to etch exposed areas of the substrate to selected intermediate depths to form the phase transition areas, and then to a final depth to form phase shifters. Following each etch stage, a corresponding etch mask can be desensitized rather than being stripped, to provide a multi-layered structure for protecting the opaque layer and substrate during subsequent etch steps. Preferably, the desensitized etch masks can be cleaned during the staged etch process to remove particulates using a non aggressive cleaning agent, such as DI water, and then stripped at the same time at the end of the process. In an alternate embodiment, the phase shifters rather than being etched into the substrate, can be formed in a deposited layer, such as a layer of spin-on-glass.

40 Claims, 4 Drawing Sheets

METHOD FOR MAKING MULTI-PHASE, PHASE SHIFTING MASKS

FIELD OF THE INVENTION

This invention relates generally to phase shifting lithography and more particularly to an improved method for making multi-phase, phase shifting masks for lithographic processes such as those used in semiconductor manufacture.

BACKGROUND OF THE INVENTION

In the manufacture of semiconductor wafers, micro lithography is used to pattern various layers on the wafer. During a micro lithographic process a layer of resist can be deposited on the wafer and exposed using an exposure tool and a mask. During the exposure process a form of radiant energy, such as ultraviolet light, can be directed through the mask to selectively expose the resist in a desired pattern. The resist can then be developed for removing either the exposed portions for a positive resist, or the unexposed portions for a negative resist. The resist remaining on the substrate forms a resist mask which protects the underlying areas of the wafer. Conversely, exposed areas of the wafer underlying openings in the resist mask can be subjected to a desired processing step (e.g., etching).

One advanced form of lithography is known as phase shift lithography. With phase shift lithography the mask can include phase shifters on selected portions of the mask pattern. The phase shifters shift the exposure energy passing therethrough, relative to exposure energy passing through an adjacent area of the mask which initiates a wave canceling effect. This canceling effect helps to overcome diffraction from the edges of the features and creates adjacent dark and bright areas on the wafer which clearly delineate the printed features. The phase shifters on the mask can be formed using a subtractive process, such as etching the substrate, or an additive process such as depositing a phase layer on the substrate.

A critical component of phase shift lithography is fabricating the phase shifting mask. The mask typically includes a substrate formed of a transparent material, such as quartz, covered with an opaque layer, such as chrome. The primary mask pattern will eventually be formed on the opaque layer. Standard mask blanks are supplied by mask manufacturers that include a substrate of a desired size, with an opaque layer deposited thereon to a desired thickness.

During a mask fabrication process, the mask blanks can be coated with a layer of resist, and the resist exposed in a desired pattern using either an optical or electron beam exposure system. An exemplary optical exposure system can include a laser mask writer having a laser adapted to directly "write" the pattern onto the resist. An exemplary electron beam exposure system can include an e-beam mask writer adapted to directly write the pattern using an electron beam scan. In general these systems can be used to expose patterns with features that are about 0.1 µm and larger in size. Development of the resist forms a resist mask that can be used to etch the opaque layer to form the mask pattern.

Following etching of the opaque layer, phase shifters can be formed on the substrate in alignment with selected features of the mask pattern. With a subtractive formation process, the phase shifters can be formed by patterning and etching the substrate to a thickness that will produce a desired phase shift (e.g., 180°). With an additive formation process, the phase shifters can be formed by depositing and etching a transparent phase layer deposited over the opaque layer.

One technique for etching a substrate to form phase shifters is described in U.S. Pat. No. 5,308,722 to Nistler and is referred to as a "voting technique". With a voting technique the substrate is etched in stages rather than all at once. For example, the substrate can be etched in increments to various intermediate depths for producing various phase shifts (e.g., 60°, 120°, 180°). The intermediate etch depths are additive such that the phase transition segments can be etched to selected intermediate depths and the phase shifters can be etched to a final depth.

An exemplary prior art voting process is shown in FIGS. 1A–1E. In FIG. 1A, a mask blank can be provided comprising a transparent substrate 10 and an opaque layer 12. Initially, a resist mask 14A can be formed on the opaque layer 12 and used to etch the opaque layer 12 in a desired pattern. Next, as shown in FIG. 1B, a resist mask 14B can be formed on the substrate 10 and opaque layer 12 and used to etch the substrate 10 to an intermediate depth. In this example, the intermediate depth is 60° ($\pi/3$). Next, as shown in FIG. 1C, a resist mask 14C can be formed on the substrate 10 and opaque layer 12 and used to etch the substrate 10 in another 60° increment. The areas of the substrate 10 initially etched go to 120°. Next, as shown in FIG. 1D, a resist mask 14D can be used to etch the substrate 10 in another 60° increment such that the initially etched areas go to 180° and the previous 60° etched areas go to 120°. The 180° etched areas become the phase shifters 17. The intermediate etched areas form phase transition areas 16 (FIG. 1E).

As shown in FIG. 1E, in the completed multi-phase mask 18, light passing through the full thickness of the substrate 10 is 180° out of phase with respect to light passing through a phase shifter 17. During a lithographic process using the mask 18, the phase shifters 17 will typically form "nulls" on the wafer. The "null" is formed at the 0 to 180 degree transition. However, with the phase transition area 16, the transition is spread over a longer area of the substrate 10 (e.g., 0°/60°/120°/180°), the 0 to 180 degree transition is spread, and the "null" does not form. Thus at the wafer (target) an image of the transition from 0° to 180° does not form. FIG. 1F illustrates the electric field on the multi-phase mask 18 during a lithographic process. FIG. 1G illustrates the light intensity on the wafer (target) during the lithographic process.

One problem with the voting technique is that the process is complicated and time consuming. In particular, each intermediate etch step requires that a corresponding resist mask 14B, 14C, 14D be removed after use. Typically, wet chemical strippers are used to strip the resist masks 14B, 14C, 14D from the substrate 10 and opaque layer 12. For a quartz substrate and a chrome opaque layer, typical wet chemical strippers include phenolic organic strippers, sulfuric acid mixtures, and solvent strippers.

In general, these chemical strippers are costly and add expense and complexity to the mask fabrication process. In addition, chemical strippers containing phenol are highly toxic, and present numerous handling and environmental disposal problems for semiconductor and mask manufacturers. In view of the foregoing, improved methods for fabricating phase shifting masks are needed in the art.

SUMMARY OF THE INVENTION

In accordance with the invention, an improved method for making multi-phase, phase shifting masks for lithography is provided. The method, simply stated, comprises: providing a transparent substrate with an opaque layer; forming a primary mask pattern on the opaque layer; and then forming phase shifters for the mask pattern using a staged etch process wherein etch masks for each stage are desensitized rather than being individually stripped. Exemplary methods for desensitizing the etch masks include UV flooding, heating, plasma etching and reactive ion etching.

This method builds up multiple etch masks that can all be removed at the same time following the staged etch process. This simplifies the phase shifter formation process because separate wet chemical stripping steps for the etch masks using aggressive chemical strippers are not required. Rather, intermediate cleaning steps using non aggressive cleaning agents, such as DI water or NBA, can be performed after each stage to remove particulates.

During each stage of the etch process, intermediate etch depths can be selected such that only a portion of the total desired phase shift is produced until the final stage. A representative sequence can form phase transition areas and then phase shifters, by etching 60°, 120° and 180° segments. Each successive resist mask can be oversized with respect to a preceding mask, such that the opaque layer and a portion of the previously etched substrate are protected during the staged etch process by multiple overlapping layers of desensitized resist. This minimizes defects because pinholes in any resist layer will probably not extend to the substrate.

In an alternate embodiment method, an additive phase shifting mask is formed. In this embodiment, an opaque layer is formed on a substrate in a primary mask pattern. A phase layer, such as a spin on glass, is deposited on the substrate and opaque layer. The phase layer is then etched in stages to form phase transition areas and phase shifters adjacent to selected edges of the primary mask pattern. During the staged etch process, each resist mask is desensitized after use, so that the resist masks overlap to form a multi layered structure for protecting the opaque layer and substrate.

DETAILED DESCRIPTION OF THE PREFERRED EMBODIMENTS

Referring to FIGS. 2A–2D, a method for making a multi-phase, phase shifting mask in accordance with the invention is shown. Initially, a mask blank 21 comprising a substrate 20 with an opaque layer 22 is provided. Standard mask blanks are manufactured and sold by mask makers for use in semiconductor manufacture. One supplier is Dupont Photoblanks of Poughkeepsie, N.Y.

The substrate 20 can comprise a transparent material having suitable optical and mechanical properties for lithographic processes. Suitable materials include quartz and silica based glass. The opaque layer 22 can comprise a highly opaque material such as chrome; chromium; mixtures of chromium, oxygen and nitrogen; and mixtures of molybdenum, silicon, oxygen and nitrogen. The opaque layer 22 can be blanket deposited on the substrate 20 and planarized to a standard thickness (e.g., 800–1200 Å).

Figure 1A:
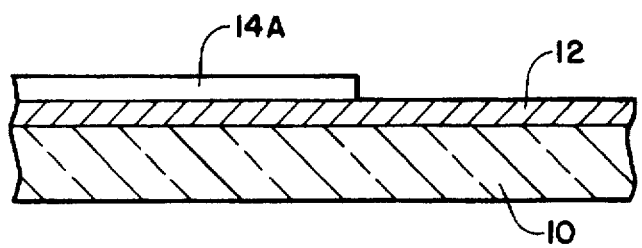
FIGS. 1A–1E are schematic cross sectional views illustrating steps in a prior art method for fabricating a phase shifting mask using a voting technique.
Figure 1B:
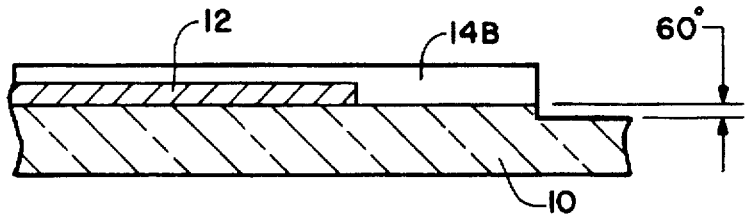
Figure 1C:
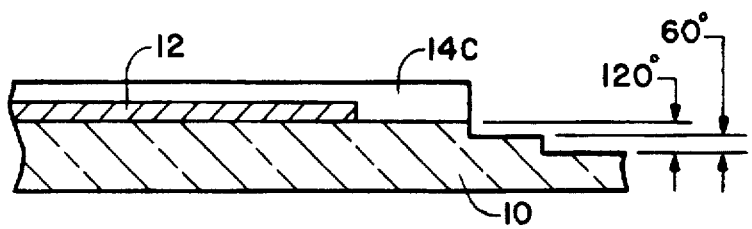
Figure 1D:
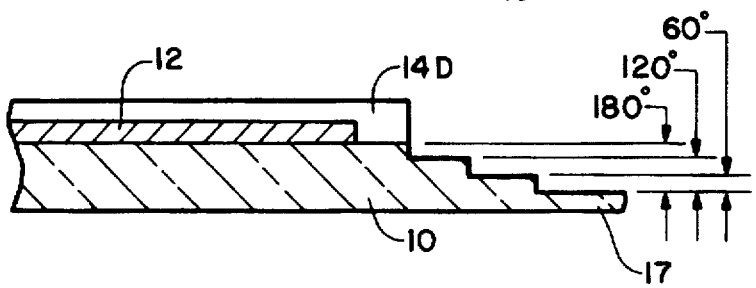
Figure 1E:
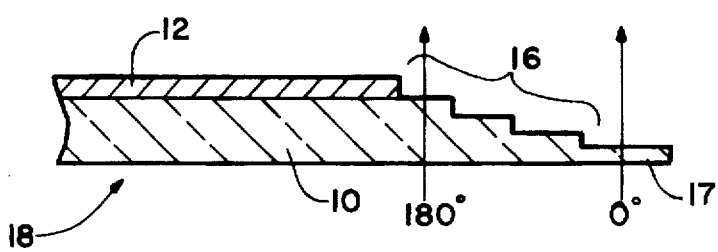
Figure 1F:
FIGS. 1F–1G are graphs illustrating operational characteristics of the mask of FIGS. 1A–1E.
Figure 1G:
Figure 2A:
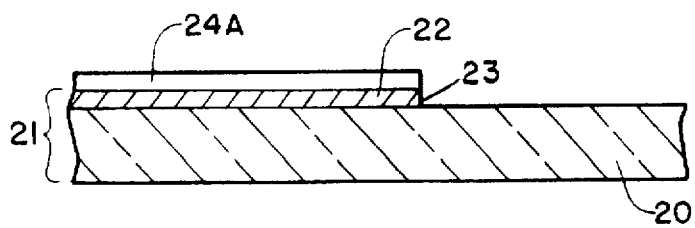
FIGS. 2A–2E are schematic cross sectional views illustrating steps in a method for fabricating a phase shifting mask in accordance with the invention using a subtractive process.

In FIG. 2A, a resist mask 24A is formed on the opaque layer 22. The resist mask 24A comprises a layer resist deposited on the opaque layer 22 to a desired thickness, exposed and then developed. Exposure of the resist can be with an optical or an e-beam method. A suitable optical resist can include 895I manufactured by OMM of East Providence, R.I. A suitable laser writer is an "ALTA 3000" manufactured by Etec Systems Inc., Hayward, Calif. A suitable e-beam system for exposing the resist can include an e-beam mask writer such as a "MEBES 4500" manufactured by ETEC Systems, Inc., Hayward, Calif.

The resist mask 24A can be used to etch the opaque layer 22 to form a primary mask pattern. By way of example, an opaque layer 22 formed of chrome can be wet etched in a mixture of acetic acid and ceric ammonium nitrate at about 20° C. One suitable wet etchant comprises CR-14 manufactured by Cyantek Corporation.

The opaque layer 22 can include edges on various portions of the pattern such as edge 23. The edge 23 can be formed by openings in the opaque layer 22 or by the outer periphery of the opaque layer 22. For some patterns it may be desirable to form a phase shifter adjacent to the edge 23 to overcome diffraction and to clearly delineate the edge 23 during a subsequent lithographic process.

Figure 2B:
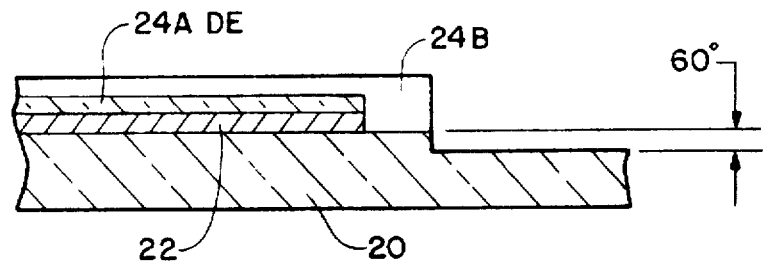

Following etching of the opaque layer 22 to form the primary mask pattern, the resist mask 24A can be desensitized to form a desensitized resist mask 24A-DE (FIG. 2B). Optionally, the resist mask 24A can be stripped rather than desensitized. However, it is preferable to strip the mask 24A along with all subsequently developed masks at the same time, at the end of the fabrication process.

In general, the "sensitivity" of a resist is a measure of its chemical response to an input energy such as exposure radiation. As used herein, the term "desensitized" means that the resist has a sufficiently low chemical response that it remains substantially unaffected by the input energy of a conventional lithographic process. Such a layer of resist can also be characterized as "toughened".

Suitable methods for desensitizing the resist mask 24A include:

1. UV stabilization wherein the resist is flooded with UV light and then baked at a temperature of about 180° C. for at least several minutes.
2. Oven baking at a temperature of 140° C. to 180° C. for at least several minutes.
3. Plasma or reactive ion etching for a time period sufficient to only partially remove the resist mask 24A.

Following the desensitizing process, the desensitized resist mask 24A-DE and substrate 20 can be cleaned to remove particulates and other contaminants. This cleaning step can be performed using a cleaning agent such as DI (de-ionized) water or a non aggressive chemical such as a solution of NBA (n-butyl acetate). Such a cleaning agent can be administered by spraying or by simply dipping the substrate 20 in a bath containing the cleaning agent. In addition, high frequency sonic waves can be utilized during or in conjunction with the cleaning step.

In general, a cleaning step presents fewer handling and disposal problems than a full blown resist stripping process, especially with a phenol based stripper or another toxic wet chemical. In addition, the desensitizing and cleaning steps are less expensive and can be performed in less time than a conventional resist stripping process.

Following the cleaning step, and as shown in FIG. 2B, a second resist mask 24B can be deposited on the desensitized resist mask 24A-DE and substrate 20 by spin-on or other deposition process. If the resist mask 24A has been stripped rather than being desensitized, the second resist mask 24B can be deposited directly on the opaque layer 22 and substrate 20.

Following depositing, the second resist mask 24B can be exposed using a laser mask writer as previously described. Following exposure, the second resist mask 24B can be developed substantially as previously described for resist mask 24A. The developed second resist mask 24B can then be used to etch the substrate 20 to a desired intermediate depth which will form one segment of a phase transition area 30 (FIG. 2E). During etching of the substrate 20 to the intermediate depth, the second resist mask 24B exposes portions of the substrate 20 that require etching and protects the remainder of the substrate 20. In the illustrative embodiment, the substrate 20 is etched to an intermediate depth that will produce a phase shift of 60° ($\pi/3$) for light passing therethrough, relative to light passing through the full thickness of the substrate 20. Alternately, other incremental etch depths such as 15° ($\pi/12$), 20° ($\pi/9$), 30° ($\pi/6$), 45° ($\pi/4$) or 90° ($\pi/2$) can be used.

One suitable process for etching the substrate 20 is plasma dry etching. For example, with a substrate 20 formed of quartz, an anisotropic dry etch process can be performed in an ion reactor using a gas etchant such as $CHF_3/O_2$. An isotropic etch process can also be performed using a suitable wet etchant such as a buffered oxide etchant (e.g., $NH_4F$:HF mixture). Etching can also be performed using magnetically enhanced reactive ion etching (MERIE).

Figure 2C:
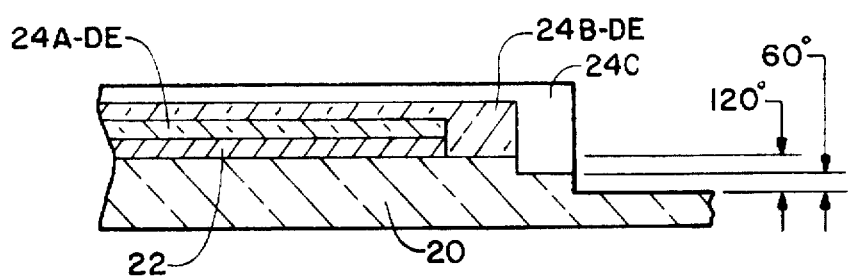

Next, as shown in FIG. 2C, the second resist mask 24B can be desensitized to form a desensitized resist mask 24B-DE. The desensitized resist mask 24B-DE can be formed using techniques such as UV stabilization, heating and etching as previously described. In addition, following the desensitizing process, the desensitized resist mask 24B-DE and substrate 20 can be cleaned to remove particulates and other contaminants using DI water or a non aggressive chemical such as NBA as previously described.

As also shown in FIG. 2C, a third resist mask 24C can be formed on the desensitized second resist mask 24B-DE using suitable exposure and development steps as previously described. The third resist mask 24C is larger than the second resist mask 24B and covers some areas of the substrate 20 that have been previously etched. Stated differently, the third resist mask 24C covers a larger surface area and additional portions of the substrate 20.

This is in contrast to a conventional voting technique as shown in FIGS. 1A-1D, wherein each successive resist mask is smaller than the preceding resist mask and the exposed areas of the substrate become progressively larger. With the present method, the overlapping masks provide additional protection for the substrate 20 during subsequent etch stages. Specifically, the stacked structure provided by the resist masks 24C, 24A-DE and 24B-DE, provides multi-layered protection for the opaque layer 22 and substrate 20 and covers larger areas or portions of the substrate 20.

The third resist mask 24C can be used to incrementally etch the substrate 20 to another 60° increment. This forms a 120° etch depth in the exposed areas previously etched and another stepped segment of the phase transition area 30 (FIG. 2E). During the 120° incremental etch, the third resist mask 24C exposes areas of the substrate 20 to be etched, and protects the remaining areas of the substrate 20. Some of the areas previously exposed are protected and some are exposed for additional etching. However, since the third resist mask 24C is larger and overlaps the desensitized second resist mask 24B-DE, additional protection is provided for the opaque layer 22 and substrate 20.

Figure 2D:
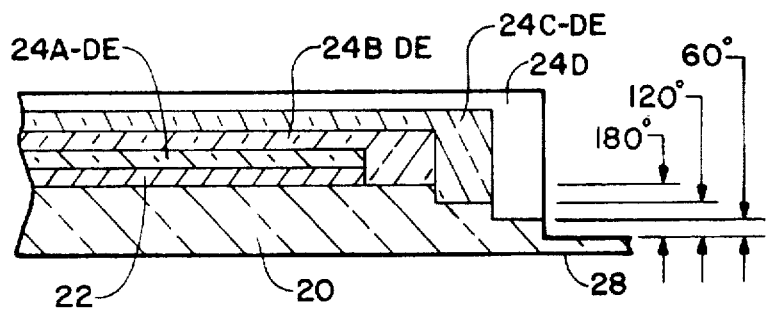
Figure 2E:
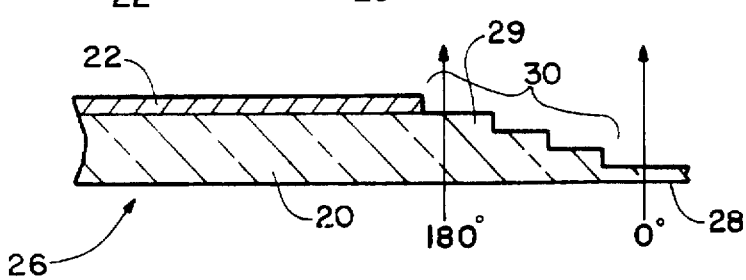

Following etching of the substrate 20 using the third resist mask 24C, the third resist mask 24C can be desensitized as previously described, to form a desensitized third resist mask 24C-DE (FIG. 2D). Following the desensitizing process, the desensitized resist mask 24C-DE (FIG. 2D) and substrate 20 can be cleaned to remove particulates and other contaminants as previously described.

Next, as shown in FIG. 2D, a fourth resist mask 24D can be formed on the desensitized third resist mask 24C-DE and substrate 20. As before, the fourth resist mask 24D is larger than the preceding third resist mask 24C. Using the fourth resist mask 24D, the substrate 20 can be etched in another 60° increment. The exposed areas previously etched go to a 180° depth to form phase shifters 28. During the 180° etch, the fourth resist mask 24D exposes areas of the substrate 20 that require etching and protects areas that have been previously etched. The desensitized second resist mask 24B-DE and the desensitized third resist mask 24C-DE provide additional protection for the opaque layer 22 and substrate 20.

Following the 180° etch increment, all of the separate resist masks can be stripped at the same time. The resist masks 24A-DE, 24B-DE, 24C-DE and 24D can be stripped using a wet chemical etch or an oxygen plasma dry etch. For a quartz substrate 20 and a chrome opaque layer 22, suitable wet chemical strippers include phenolic organic strippers, sulfuric acid mixtures, and solvent strippers. However, because these wet chemical strippers are only applied one time at the end of the etch process, the quantity for disposal is much less than with a conventional voting technique.

The completed mask 26 is shown in FIG. 2E. The mask 26 includes the substrate 20 and opaque layer 22 which carries the primary mask pattern. In addition, the mask 26 includes the phase shifters 28 formed adjacent to selected edges 23 (FIG. 2A) of the mask pattern. The phase shifters 28 are adapted to achieve a 180 phase shift for light passing therethrough relative to light passing through a full thickness portion 29 of the substrate 20. A "null" is formed at the 0° to 180° transition. However, due to the phase transition area 30 the null is spread out over a relatively long portion of the substrate. Accordingly the "null" and the transition from 0° to 180° do not form an image at the target.

One advantage of the method outlined in FIGS. 2A-2D is that the opaque layer 22 and the substrate 20 are protected during etching of the substrate 20 by the overlapping resist masks 24A-DE, 24B-DE, 24C-DE, 24D. Although pin holes and defects can form in any one layer of resist, it is unlikely that pin holes and defects on adjacent layers will align and extend through to the substrate 20. This helps to prevent defect formation in the phase shift areas 28 and phase transition areas 30.

Another advantage is provided by the sizing of the multiple resist masks 24A-DE, 24B-DE, 24C-DE, 24D. Specifically, these masks form a multi-layered, or stacked structure, in which the overlapping layers are progressively larger, and provide additional protection for the substrate 20 during the staged etch process.

The method also provides process simplification because an aggressive wet chemical strip for multiple resist masks is not required following each etching step, as with a conventional voting technique. In particular, the non-aggressive cleaning agents used after each incremental etch step can be easier to administer than aggressive resist strippers. For example, a wet bath or spray process can be used to dispense these non-aggressive cleaning agents. Still further, disposal of a non-aggressive cleaning agent, such as DI water, can be performed with fewer environmental problems than phenol based strippers used in conventional processes.

Figure 3A:
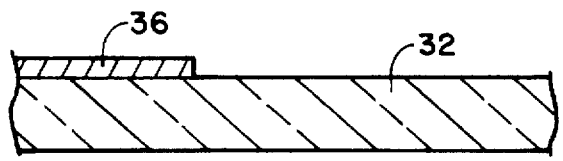
FIGS. 3A–3F are schematic cross sectional views illustrating steps in an alternate embodiment additive process for fabricating a phase shifting mask.

Referring to FIGS. 3A–3F, a method for forming a phase shifting mask in accordance with an alternate embodiment of the invention is shown. In FIG. 3A, a transparent substrate 32 includes a patterned opaque layer 36. The opaque layer 36 can be formed on the substrate 32 and patterned substantially as previously described for opaque layer 22 (FIG. 2A) to form a primary mask pattern.

Figure 3B:
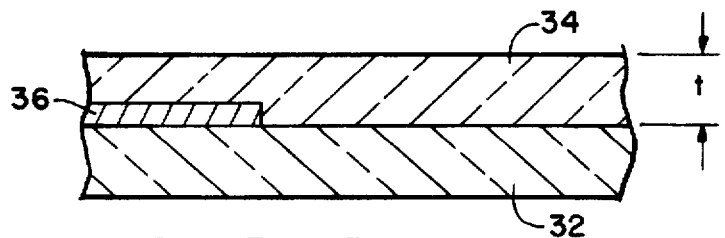

Next, as shown in FIG. 3B, a phase layer 34 is formed on the opaque layer 36 and substrate 32. The phase layer 34 can be a transparent material such as a spin on glass (SOG), TEOS (tetraethyl orthosilicate), or an oxide, deposited to a required thickness "t". The thickness "t" can be selected to provide a desired phase shift (e.g., 180°) for light passing therethrough relative to light passing through the substrate 32 only. This thickness "t" can be determined by the well known formula t=iλ/2(n−1)

where t=thickness i=an odd integer

λ=wavelength of exposure light n=refractive index of phase shift material at the exposure wavelength.

Figure 3C:
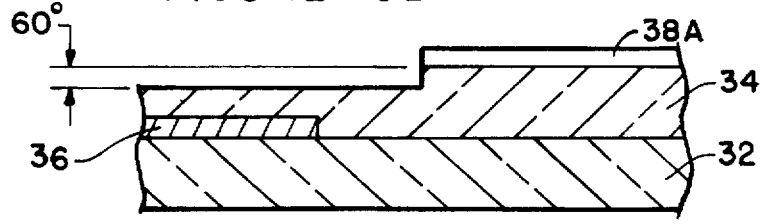

Next, as shown in FIG. 3C, a resist mask 38A can be formed on the phase layer 34 and patterned to expose areas of the phase layer 34 for etching. An incremental etch can then be performed on the phase layer 34 to a desired intermediate depth (e.g., 60°). This incremental etch can be performed utilizing a plasma dry etching process as previously described for etching substrate 20 (FIG. 2B). For example, with a phase layer 34 formed of spin-on-glass (SOG), a dry etch can be performed in an ion reactor using a gas etchant such as $CHF_3/O_2$. Etching can also be performed using magnetically enhanced reactive ion etching (MERIE).

Figure 3D:
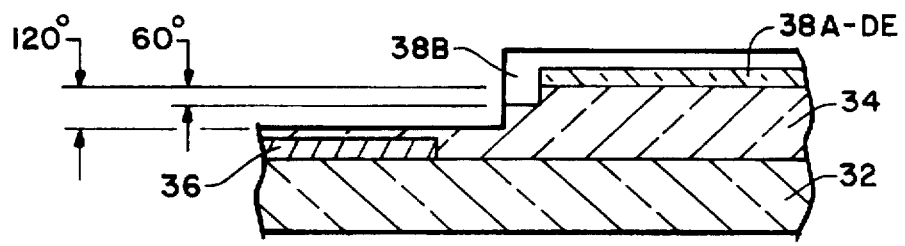

Next, as shown in FIG. 3D, following the (60°) incremental etch, the resist mask 38A can be desensitized as previously described to form a desensitized resist mask 38A-DE. In addition, a cleaning step as previously described, can be performed on the desensitized resist mask 38A-DE and phase layer 34 using a cleaning agent such as DI water. A second resist mask 38B can then be formed on the desensitized resist mask 38A-DE and on the phase layer 34. The second resist mask 38B exposes areas of the phase layer 34 for another incremental etch and protects the remainder of the phase layer 34. This incremental etch can be to a greater depth (e.g., 120°) than the previous incremental etch. During this incremental etch, the desensitized resist mask 38A-DE provides additional protection for the phase layer 34.

Figure 3E:
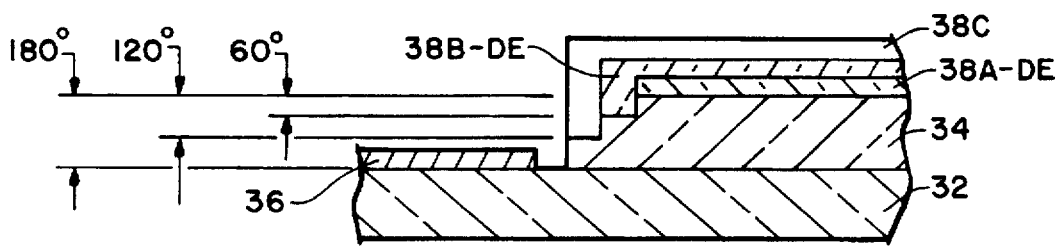

Next, as shown in FIG. 3E, following the (120°) incremental etch, the second resist mask 38B can be desensitized as previously described to form a desensitized second resist mask 38B-DE. In addition, a cleaning step can be performed as previously described. A third resist mask 38C can then be formed on the desensitized second resist mask 38B-DE. The third resist mask 38C exposes areas of the phase layer 34 for a full (180°) etch. Following this etch step, all of the resist masks 38A-DE, 38B-DE, 38C can be stripped using a suitable stripping process as previously described.

Figure 3F:
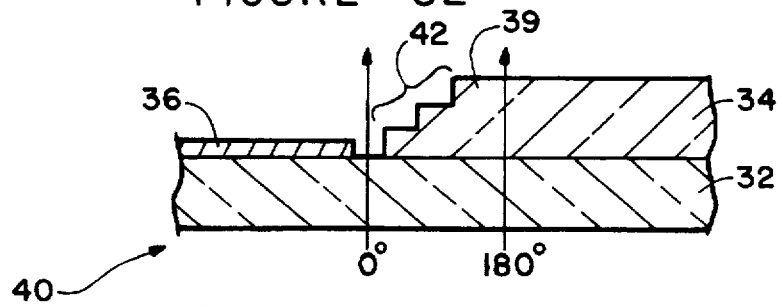

As shown in FIG. 3F, the completed additive mask 40 includes the opaque layer 36 which carries the primary mask pattern. The mask 40 also includes the phase layer 34 having phase shifters 39 and phase transition areas 42. The phase transition areas 42 are spaced from selected edges of the opaque layer 36 by a desired distance determined by the dimensions of the third resist mask 38C. During a lithographic process using the mask 40 light passing through a phase shifter 39 is phase shifted 180° relative to 0° light passing just through the substrate 32. Due to the point spread function of the lithographic process, the phase transition areas 42 will not form an image on the target.

OPERATION

Figure 4:
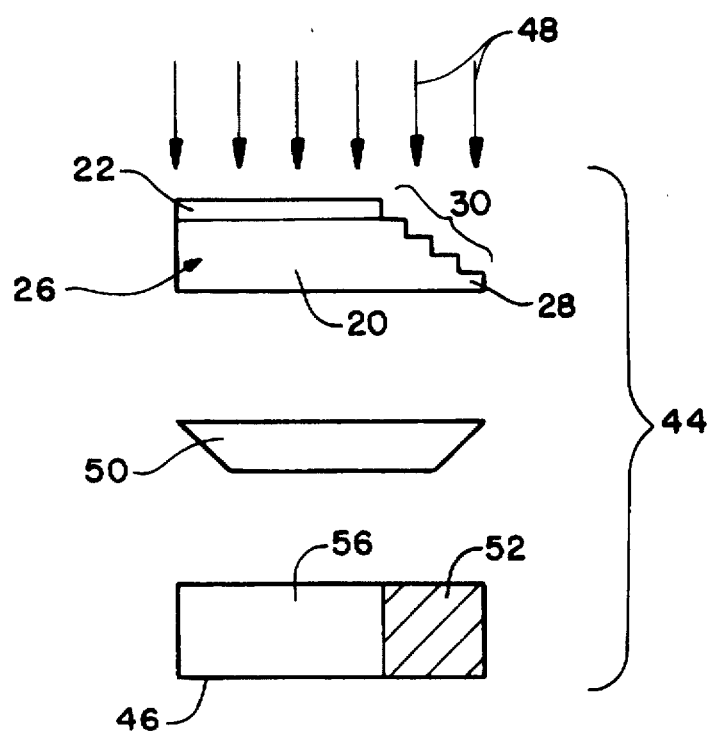
FIG. 4 is a schematic view of a lithographic system using a phase shifting mask constructed in accordance with the invention.

Referring to FIG. 4, the mask 26 is shown in use in a lithographic system 44 during a photolithographic process for patterning a target 46, such as a semiconductor wafer. The lithographic system 44 is adapted to direct incident energy 48 (e.g., UV light) through the mask 26 and through a reduction lens 50 onto the target 46. The target 46 can be coated with a layer of resist that is exposed in a pattern that corresponds to the primary mask pattern formed by the opaque layer 22. Selected features of the mask pattern can include phase shifters 28 and phase transition areas 30 as required. The phase shifters 28 and phase transition areas 30 were previously formed using the incremental etching process illustrated in FIGS. 2A–2D.

The opaque layer 22 and phase shifters 28 represent a 0° to 180° transition. The phase transition areas 30 spread this transition over a relatively large portion of the substrate 20. Accordingly the "null" does not image at the target 46. This forms a feature 56 on the target 46 having a clearly delineated edge (i.e., boundary) with respect to an adjacent portion 52 of the target 46. Furthermore, due to the multi stage etch process used to form the phase shifters 28 and phase transition areas 30, there are less likely to be defects in the mask 26 capable of forming an image on the target 46.

Thus the invention provides an improved method for forming multi-phase, phase shifting masks and an improved phase shifting mask. While the invention has been described with reference to certain preferred embodiments, as will be apparent to those skilled in the art, certain changes and modifications can be made without departing from the scope of the invention as defined by the following claims.

What is claimed is:

1. A method for making a phase shifting mask comprising:

providing a transparent substrate with an opaque layer;

forming a primary mask pattern on the opaque layer; and forming phase shifters for the primary mask pattern by forming a first resist mask on the substrate, etching the substrate to a first depth using the first resist mask, desensitizing the first resist mask, forming a second resist mask on the desensitized first resist mask, and then etching the substrate to a second depth using the second resist mask.

2. The method as claimed in claim 1 further comprising cleaning the substrate and desensitized first resist mask prior to forming the second resist mask.

3. The method as claimed in claim 1 further comprising following etching to the second depth, stripping the first and second resist masks.

4. The method as claimed in claim 1 further comprising desensitizing the second resist mask, forming a third resist mask on the desensitized second resist mask and then etching the substrate to a third depth using the third resist mask.

5. The method as claimed in claim 4 wherein the third depth is selected to provide a 180° phase shift and the first and second depths are selected to provide 60° phase shift increments.

6. A method for making a phase shifting mask comprising:
   providing a mask blank comprising a transparent substrate and an opaque layer;
   patterning the opaque layer to form a primary mask pattern;
   forming phase shifters and phase transition areas for the mask pattern by etching the substrate in at least two stages using successively deposited and desensitized resist masks; and
   following etching of the substrate, stripping all of the resist masks.

7. The method as claimed in claim 6 further comprising cleaning the desensitized resist masks prior to each etching stage.

8. The method as claimed in claim 6 wherein the desensitized resist masks are desensitized using a method selected from the group consisting of UV flooding, heating, and dry etching.

9. The method as claimed in claim 6 and wherein the second resist mask covers a larger area of the substrate than the first resist mask.

10. A method for making a phase shifting mask comprising:
    providing a transparent substrate;
    forming a first resist mask on the substrate configured to expose selected areas of the substrate;
    etching the selected areas to a first depth using the first resist mask to form phase transition areas;
    desensitizing the first resist mask;
    forming a second resist mask on the desensitized first resist mask, said second resist mask covering additional portions of the substrate than the first resist mask and configured to partially expose the selected areas of the substrate;
    etching the partially exposed selected areas to a second depth using the second resist mask to form phase shifters; and
    stripping the first and second resist masks.

11. The method as claimed in claim 10 wherein stripping the first and second resist masks is at a same time.

12. The method as claimed in claim 10 further comprising cleaning the desensitized first resist mask prior to etching the partially exposed selected areas.

13. The method as claimed in claim 10 wherein the desensitized first resist mask is desensitized using a method selected from the group consisting of UV flooding, heating, and dry etching.

14. The method as claimed in claim 10 further comprising desensitizing the second resist mask forming a third resist mask thereon and etching the substrate to a third depth.

15. A method for making a phase shifting mask comprising:
    providing a transparent substrate with an opaque layer;
    etching the opaque layer with openings to form a primary mask pattern;
    forming phase shifters and phase transition areas on the substrate using a staged etch process comprising:
    forming a first resist mask on the opaque layer and substrate,
    etching the substrate to a first depth using the first resist mask,
    desensitizing the first resist mask,
    cleaning the desensitized first resist mask,
    forming a second resist mask on the desensitized first resist mask and on portions of the etched substrate,
    etching exposed portions of the substrate to a second depth using the second resist mask, and then
    stripping the first and second resist masks at a same time.

16. The method as claimed in claim 15 further comprising desensitizing the second resist mask, forming a third resist mask on the desensitized second resist mask and etching the substrate to a third depth using the third resist mask.

17. The method as claimed in claim 16 wherein the second resist mask covers additional portions of the substrate than the first resist mask and the third resist mask covers additional portions of the substrate than the second resist mask.

18. The method as claimed in claim 17 further comprising desensitizing the third resist mask, forming a fourth resist mask on the desensitized third resist mask and etching the substrate to a fourth depth using the fourth resist mask.

19. The method as claimed in claim 18 wherein the cleaning step comprises spraying or dipping in a cleaning agent selected from the group consisting of DI water and N-butyl acetate.

20. A method for making a phase shifting mask comprising:
    providing a transparent substrate with an opaque layer thereon;
    forming a mask pattern by etching the opaque layer;
    forming phase transition areas for the mask pattern by forming a first resist mask on the substrate, etching the substrate to a first depth, desensitizing the first resist mask, forming a second resist mask on the desensitized first resist mask, etching the substrate to a second depth;
    desensitizing the second resist mask; and
    forming phase shifters for the mask pattern by forming a third resist mask on the desensitized second resist mask and etching the substrate to a third depth.

21. The method as claimed in claim 20 further comprising cleaning the desensitized first resist mask prior to forming the second resist mask.

22. The method as claimed in claim 20 further comprising cleaning the desensitized second resist mask prior to forming the third resist mask.

23. The method as claimed in claim 20 further comprising stripping the first, second and third resist masks at a same time.

24. The method as claimed in claim 20 wherein desensitizing the first and second resist masks comprises a process selected from the group consisting of UV flooding, heating and dry etching.

25. The method as claimed in claim 20 wherein the second resist mask covers a larger area of the substrate than the first resist mask and the third resist mask covers a larger area of the substrate than the second resist mask.

26. The method as claimed in claim 20 wherein the third depth is selected to achieve a phase shift of 180° and the first and second depths are selected to achieve phase shifts of 60° and 120° respectively.

27. A method for forming a phase shifting mask comprising:
    providing a mask blank comprising a transparent substrate and an opaque layer;
    etching the opaque layer to form a primary mask pattern;
    forming a first resist mask on the substrate;

etching the substrate to a first depth using the first resist mask to form a phase transition area;

desensitizing the first resist mask;

forming a second resist mask on the desensitized resist mask, said second resist mask covering a larger area of the substrate than the first resist mask;

etching the substrate to a second depth using the second resist mask;

desensitizing the second resist mask;

forming a third resist mask on the desensitized second resist mask, said third resist mask covering a larger area of the substrate than the second resist mask;

etching the substrate to a third depth using the third resist mask; and stripping the first and second desensitized resist masks and the third resist mask at a same time.

28. The method as claimed in claim 27 wherein the third depth is selected to achieve a phase shift of 180° and the first and second depths are selected to achieve phase shifts of 60° and 120° respectively.

29. The method as claimed in claim 27 further comprising desensitizing the third resist mask, forming a fourth resist mask on the desensitized third resist mask and etching the substrate to a fourth depth.

30. The method as claimed in claim 27 further comprising processing a semiconductor wafer using the phase shifting mask.

31. A method for making a phase shifting mask comprising:

providing a transparent substrate;

forming an opaque layer on the phase layer and patterning the opaque layer to form a primary mask pattern;

forming a phase layer on the substrate;

forming phase shifters for the primary mask pattern by forming a first resist mask on the phase layer, etching the phase layer to a first depth using the first resist mask, desensitizing the first resist mask, forming a second resist mask on the desensitized first resist mask, and then etching the phase layer to a second depth using the second resist mask.

32. The method as claimed in claim 31 further comprising desensitizing the second resist mask, forming a third resist mask on the desensitized second resist mask, and then etching the phase layer to a third depth using the third resist mask.

33. The method as claimed in claim 31 wherein the phase layer comprises a spin on glass.

34. The method as claimed in claim 31 wherein etching the phase layer comprises a dry etch process.

35. The method as claimed in claim 31 wherein desensitizing the resist comprises a method selected from the group consisting of UV flooding, heating, and dry etching.

36. The method as claimed in claim 31 further comprising cleaning the desensitized first resist mask prior to forming the second resist mask.

37. A method for making a phase shifting mask comprising:

providing a transparent substrate;

forming an opaque layer on the phase layer and patterning the opaque layer to form a primary mask pattern;

forming a transparent phase layer on the opaque layer and substrate, said phase layer selected to provide a phase shift of 180°;

forming a first resist mask on the phase layer and etching the phase layer adjacent to an edge of the opaque layer to a first depth;

desensitizing the first resist mask;

forming a second resist mask on the desensitized first resist mask and etching the phase layer adjacent to the edge to a second depth;

desensitizing the second resist mask; and forming a third resist mask on the desensitized second resist mask and etching the phase layer adjacent to the edge to the substrate.

38. The method as claimed in claim 37 wherein the phase layer comprises spin on glass.

39. The method as claimed in claim 38 further comprising cleaning the desensitized first resist mask prior to forming the second resist mask.

40. The method as claimed in claim 39 further comprising cleaning the desensitized second resist mask prior to forming the third resist mask.

* * * * *

UNITED STATES PATENT AND TRADEMARK OFFICE
CERTIFICATE OF CORRECTION

PATENT NO. : 5,759,724
DATED : June 2, 1998
INVENTOR(S) : J. Brett Rolfson

It is certified that error appears in the above-identified patent and that said Letters Patent is hereby corrected as shown below:

TITLE PAGE, COLUMN 1,

ITEM [75] INVENTOR: "Rolson" should read --Rolfson--.

Signed and Sealed this

Twenty-fourth Day of November, 1998

Attest:

BRUCE LEHMAN

Attesting Officer     Commissioner of Patents and Trademarks